(12) United States Patent
Zhang

(10) Patent No.: US 8,593,310 B1
(45) Date of Patent: Nov. 26, 2013

(54) DATA-DRIVEN VARIABLE LENGTH ENCODING OF FIXED-LENGTH DATA

(71) Applicant: Li Zhang, Mountain View, CA (US)

(72) Inventor: Li Zhang, Mountain View, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 13/686,815

(22) Filed: Nov. 27, 2012

(51) Int. Cl.
*H03M 7/40* (2006.01)

(52) U.S. Cl.
USPC .............................................. 341/67; 341/65

(58) Field of Classification Search
USPC ..................................................... 341/65, 67
See application file for complete search history.

(56) References Cited

U.S. PATENT DOCUMENTS

| 6,600,432 | B2 * | 7/2003 | Green | 341/67 |
| 6,633,242 | B2 * | 10/2003 | Brown | 341/50 |
| 7,148,821 | B2 * | 12/2006 | Thirumoorthy | 341/67 |
| 7,436,332 | B2 * | 10/2008 | Lakus-Becker | 341/59 |

* cited by examiner

*Primary Examiner* — Khai M Nguyen
(74) *Attorney, Agent, or Firm* — Fenwick & West LLP

(57) ABSTRACT

A data-driven encoder receives fixed-length bit fields and generates variable length bit fields that are, on average, smaller than the fixed-length bit fields. The data-driven encoder removes leading zeros from a fixed-length bit field and appends a prefix code to the remaining bits that identifies the number of remaining bits. In an embodiment, the data-driven encoder may further append leading zeros before the prefix code to produce variable length bit fields having sizes that are integer multiples of bytes. The decoder identifies the original fixed-length bit fields from the variable length encoded bit fields.

11 Claims, 7 Drawing Sheets

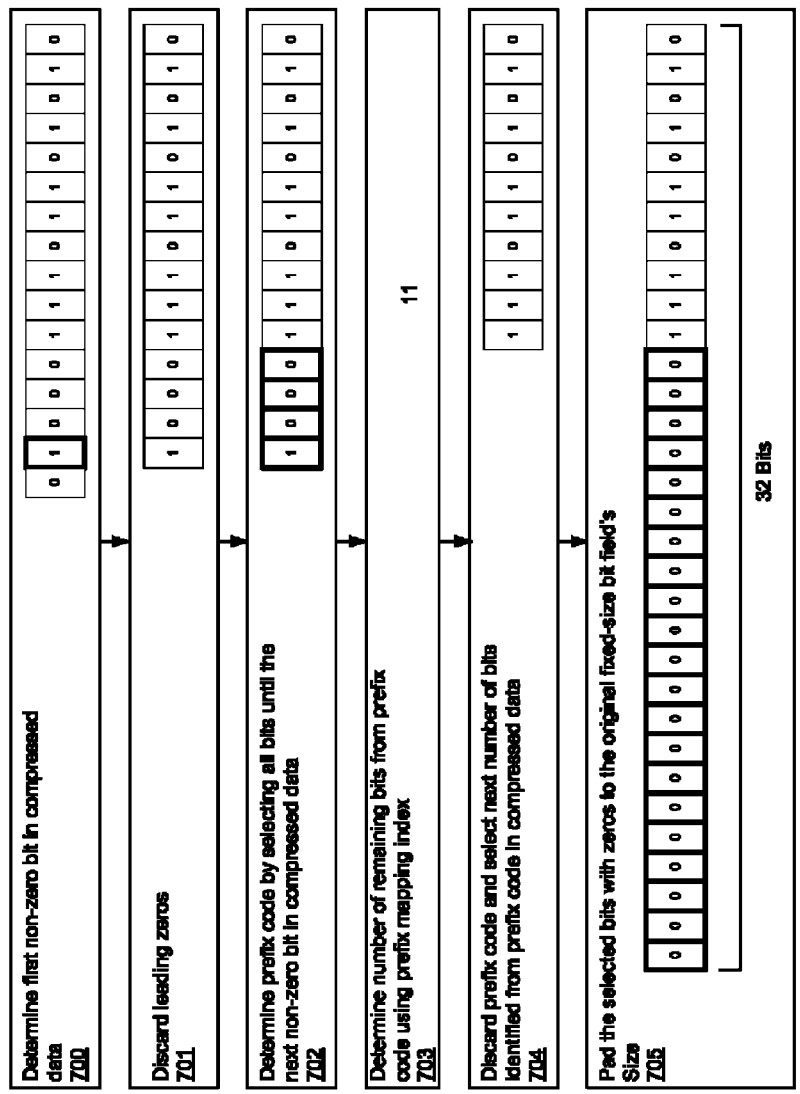

DATA-DRIVEN VARIABLE LENGTH ENCODING OF FIXED-LENGTH DATA

BACKGROUND

This invention relates generally to data storage, in particular, to digital data compression.

Modern large scale computing applications, such as social networking systems, receive and generate vast quantities of data continuously. Examples of data maintained by large scale applications include user information, images, videos, text posts, emails, performance logs, search indices, metadata, or any other suitable data. As the volume of data increases, the resources needed to store, serve, and secure this data increases correspondingly. Various data compression techniques may be to reduce the volume of data without losing information. Different data compression technique make tradeoffs between factors such as compression speed, decompression speed, compression efficiency, and memory usage during compression. Compression speed is determined by the complexity of the steps for compressing data. Similarly, decompression speed is determined by the complexity of the steps for decompressing data. Compression efficiency measures the size of the compressed data relative to the uncompressed data.

Various requirements determine the compression technique used for a system. For example, if data is stored offline compression speed is immaterial, a compression technique with high compression efficiency and high decompression speed may be selected at the expense of compression speed. For example, a system storing and streaming movies may use a compression technique having poor compression speed but good compression efficiency and decompression speed. On the other hand, for systems storing and serving data in real-time—websites, social networking systems, games, etc.—compression speed and decompression speed may be more important than compression efficiency.

SUMMARY

A data-driven variable length encoder (DDVL-E) and a corresponding data-driven variable length decoder (DDVL-D) enable compression and decompression of data for real-time data services, such as social networking systems. The DDVL-E receives fixed-length bit fields as input, and provides variable length encoded bit fields as output. On average, the encoded bit fields have a smaller size than the input fixed-length bit fields. To reduce data storage resources, the encoded bit fields are stored rather than the fixed-length bit fields. To recover the compressed data, the DDVL-D generates a fixed-length bid field from an encoded variable length bit field.

To reduce the size of a fixed-length bit field, the DDVL-E determines a most significant bit of the fixed-length bit field, and replaces leading zeros in the fixed-length bid field with a variable length prefix code. The prefix code identifies the number of bits of the fixed-length bit field with the leading zeros removed. To reconstruct the original bit field from the encoded bit field, the DDVL-D first identifies the prefix code and determines the number of the remaining bits of the fixed-length bit field from the prefix code. The remaining bits are identified as the number of bits following the prefix code. Leading zeros may be appended to the remaining bits to obtain the length of the original fixed-length bit field.

BRIEF DESCRIPTION OF THE DRAWINGS

FIG. 7 illustrates a process for decompressing data using a data-driven variable length decoder, according to one embodiment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

System Overview

Figure 1:
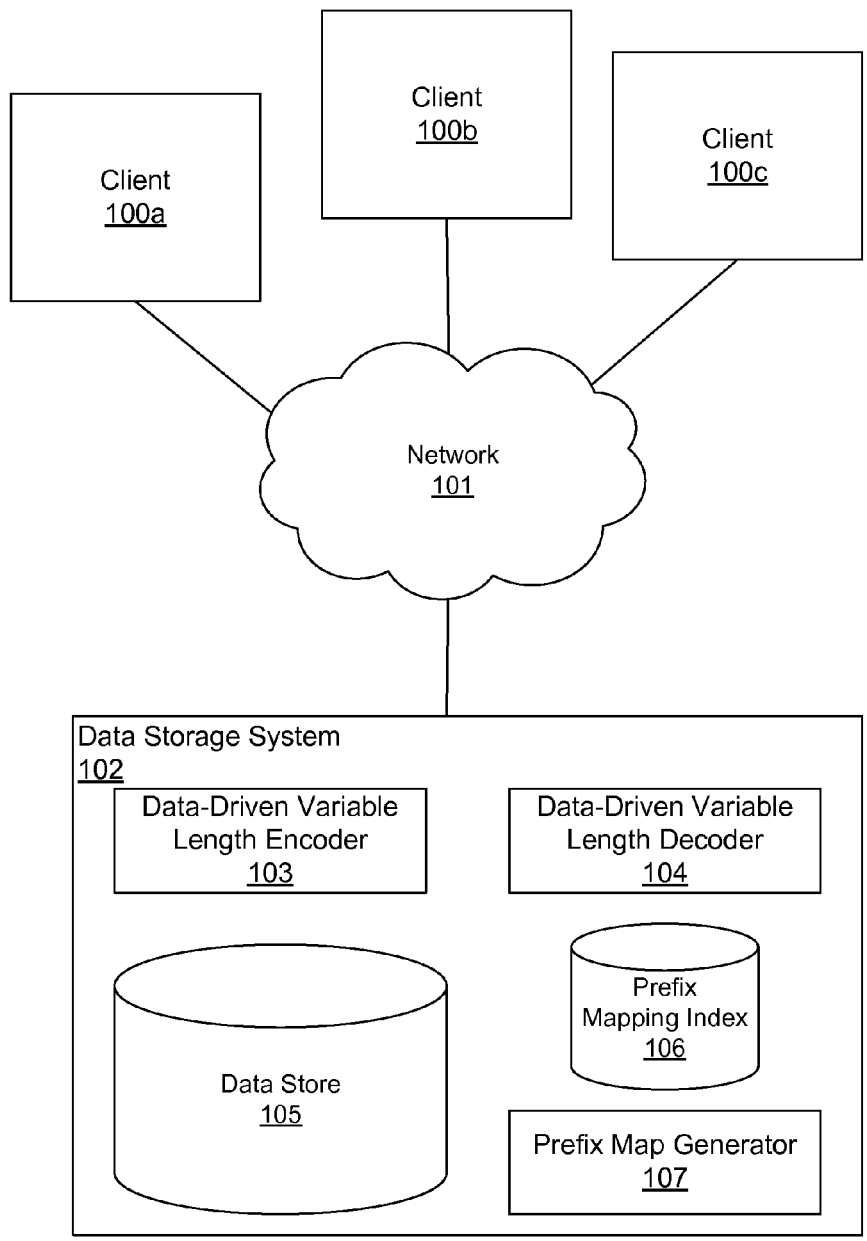
FIG. 1 illustrates an embodiment of a data storage system environment, according to one embodiment.

FIG. 1 illustrates one embodiment of a system environment including a data storage system 102. In the embodiment shown by FIG. 1, the data storage system 102 communicates with one or more clients 100a, 100b, 100c (also refereed to individually and collectively using reference number 100) via a network 101. In other embodiments, the system environment may include different and/or additional components than those shown by FIG. 1.

The network 101 enables communications between the clients 100 and the data storage system 102. In one embodiment, the network 101 uses standard communications technologies and/or protocols. Examples of technologies used by the network 101 to communicate information includeEthernet, 802.11, worldwide interoperability for microwave access (WiMAX), 3G, 4G, long term evolution (LTE), digital subscriber line (DSL), asynchronous transfer mode (ATM), InfiniBand, PCI Express Advanced Switching, etc. The network 101 may comprise any combination of local area and/or wide area networks using both wireless and wired communications technologies and/or protocols.

The clients 100 are any computer system generating data, at least a portion of which is stored. Examples of clients 100 include servers, mobile phones, desktop computers, laptop computers, tablet computers, or any other suitable computing device. Data generated by a client 100 is communicated to the data storage system 102 for storage. Data stored by the data storage system 102 may be subsequently retrieved by a client 100.

The data storage system 102 compresses and stores data received from one or more clients 100. The data storage system 102 also decompresses stored data and communicates the decompressed data to a client 100 based on a request from the client 100. The data storage system 102 may be any system capable of storing and serving data. For example, the data storage system 102 may be a desktop computer, a laptop computer a web server, a database server, a mobile computing device, or other suitable computing device with data processing and data communication capabilities. In one embodiment, the data storage system 102 is a software module operating as part of a client 100.

Data Storage System Architecture

In the embodiment shown by FIG. 1, the data storage system 102 includes a data-driven variable length encoder (DDVL-E) 103, a data-driven variable length decoder (DDVL-D) 104, a data store 105, a prefix mapping index 106, and a prefix map generator 107. However, in other embodiments, the data storage system 102 may include different and/or additional components. Further, conventional components of the data storage system 102 are omitted from FIG. 1 for clarity.

The DDVL-E 103 receives digital data as input and outputs a compressed representation of the input data. The compression technique used by the DDVL-E 103 is lossless, allowing the input data to be reproduced with 100% accuracy from its compressed representation. The DDVL-E 103 uses a data-driven variable length encoding scheme to compress the input data. In one embodiment, the DDVL-E 103 compresses digital data in parts. For example, the DDVL-E 103 compresses 64 bits, or 8 bytes, of data at a time or compresses 32 bits, or 4 bytes, of data at a time.

Figure 2:
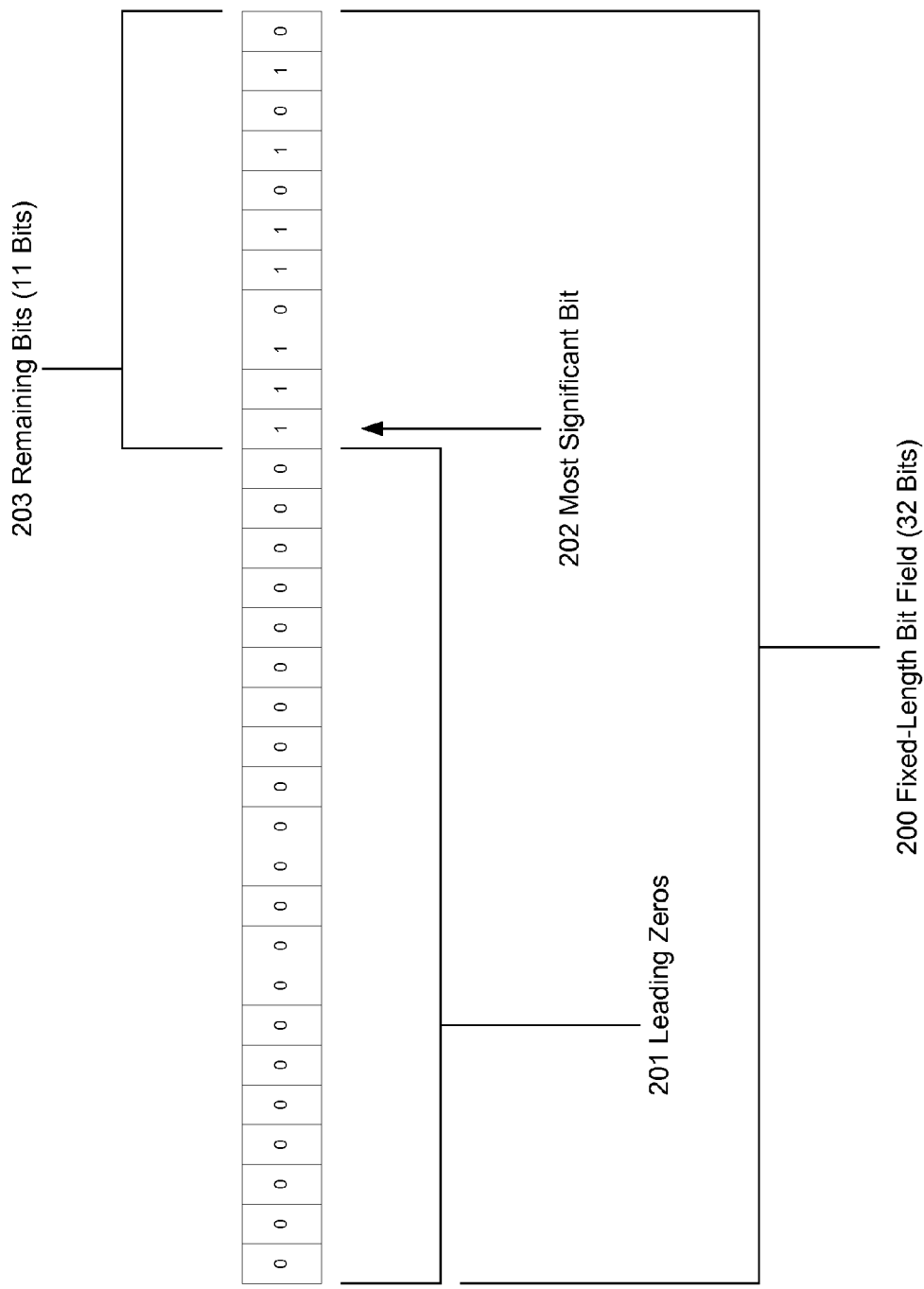
FIG. 2 illustrates an example of a fixed-length bit field, showing the leading zeros, most significant bit, and remaining bits.

FIG. 2 illustrates an example of a fixed-length portion of data. Specifically, FIG. 2 shows a fixed-length portion of data, or "bit field," 200 including 32 bits. Often, fewer bits than the length of a bit field may be sufficient to represent data, so one or more leading zeros 201 are included in the fixed-length bit field so that information is stored in each bit of the fixed-length bit field. For example, eight bits of a 32 bit field are sufficient to represent information represented by the data field, so the data field includes 24 leading zeros. The first non-zero bit of the fixed-length bit field 200 is the most significant bit 202 of the bit field 200. Removing one or more of the leading zeros 201 allows the fixed-length bit field 200 to be compressed. After removing the leading zeros 201, bits not removed from the fixed-length bit field 200 are identified herein as remaining bits 203. The DDVL-E 103 replaces the leading zeros 201 with an, on average, shorter prefix code describing the length of the fixed-length bit field used to generate a compressed bit field.

Returning to the description of FIG. 1, the DDVL-D 104 receives encoded data (also referred to as "compressed data") and decompresses the encoded data to fixed-length bit fields. Hence, the DDVL-D 104 decompresses data compressed by the DDVL-E 103. Decompression by the DDVL-D 104 is further described below.

The data store 105 stores data received from the clients 100 after compression by the DDVL-E 103. Compressed data stored in the data store 105 is retrieved and decompressed by the DDVL-D 104 to obtain the original data. The data store 105 may be implemented using a number of different software and/or hardware components. In one embodiment, the data store 105 is a memory-resident database stored in the random access memory (RAM) of the data storage system 102. Alternatively, the data store 105 is an on-chip cache that is part of a processor. In yet another embodiment, the data store 105 is a software and hardware hybrid system comprising database software, RAM, and hard disc or flash storage.

The prefix mapping index 106 is a data structure that maps prefix codes to lengths. Leading zeros of a fixed-length bit field are truncated and a prefix code obtained from the prefix mapping index 106 is appended to the remaining bits of the fixed-length bit field to create a compressed bit field. A prefix codes identifies the number of bits comprising the remaining bits 203. In one embodiment, the prefix codes are binary codes having a single leading non-zero bit and a variable number of following zeros, with each prefix code representing a number of bits. Having a single non-zero bit as the first bit of a prefix code simplifies determination of the separation between a prefix code and data following the prefix code. Because a prefix code has a single non-zero bit, the first non-zero bit after the prefix code will indicates the start of the remaining bits 203. The prefix mapping index 106 includes a list of prefix codes and the number of bits represented by each of the prefix codes.

Figure 3:
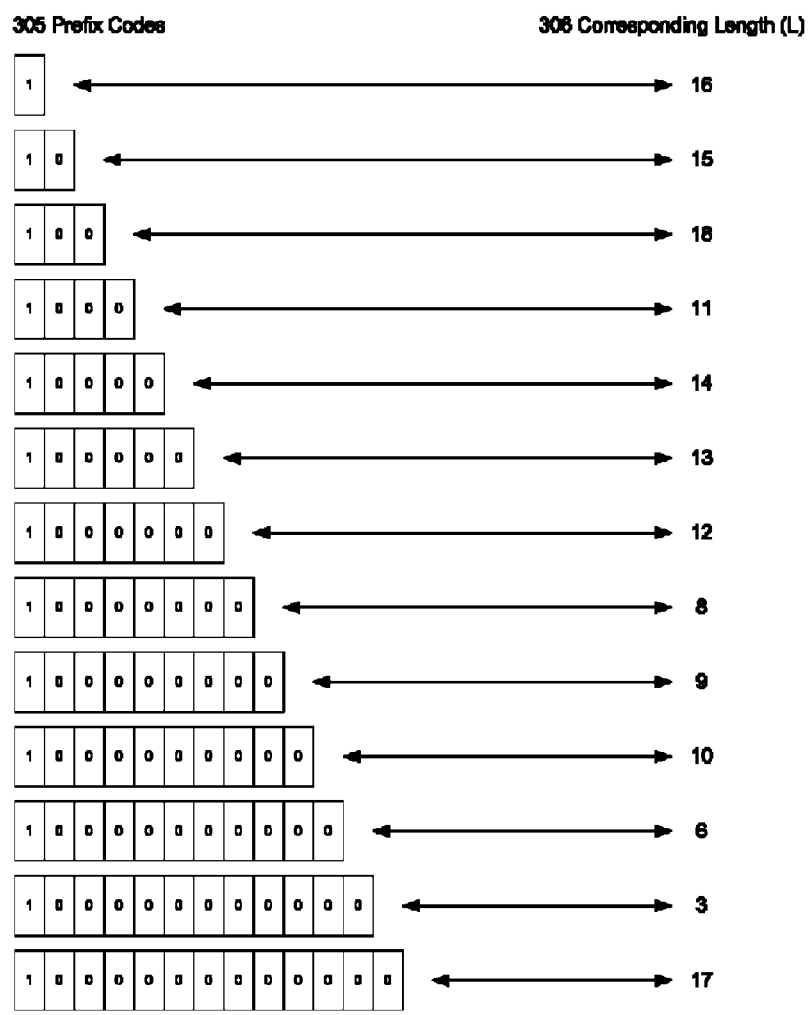
FIG. 3 illustrates an example of a prefix mapping index converting between prefix codes and numbers of bits, according to one embodiment.

FIG. 3 illustrates one embodiment of a prefix mapping index 106. For purposes of illustration, FIG. 3 shows a partial view of the prefix mapping index 106. In one embodiment, a complete prefix mapping index 106 includes a number of entries equal to one more than the number of bits in the fixed-length bit fields compressed by the DDVL-E 103. For example, the prefix mapping index 106 includes an entry for each possible length of the remaining bits 203 in a fixed-length bit field after truncation of the leading zeros 201. For example, if the DDVL-E 103 compresses 64-bit fields at a time, the prefix mapping index 106 includes 65 entries, one for each possible length of the remaining bits 203.

The prefix codes 305 stored in the prefix mapping index 106 are multiple-bit values such as "1," "10," "100," "1000," "10000," etc. In one embodiment, different numbers of bits 306 are associated with prefix codes 305 so that more common numbers of bits are represented by shorter prefix codes 305. In the prefix mapping index 106 shown by FIG. 3, the remaining bits 203 are statistically most likely to be 16 bits; hence, the shortest prefix code, "1," is used to represent 16 bits. In the example of FIG. 3, the next most common number of bits for the remaining bits 203 is 15, so the next shortest prefix code, "10," denotes 15 bits. Referring to FIG. 2, the example bit field 200 includes 11 remaining bits 203. Encoding this bit field 200 using the prefix mapping index 106 shown in FIG. 3 replaces the leading zeros 201 of the bit field with a prefix code of "1000," which identifies 11 bits. In another embodiment the number of bits 306 associated with prefix codes is determined by compressing a sample data set using various candidate mappings of prefix codes 305 to numbers of bits 306, and choosing the candidate mapping providing the best compression. Any other suitable methods of associating prefix codes 305 with numbers of bits 306 may be used.

The prefix map generator 107 generates a prefix mapping index 106 for a data storage system 102 to efficiently compress stored data. In one embodiment, the prefix map generator 107 generates the prefix mapping index 106 based on one or more statistical properties of data expected to be stored by the data storage system 102. For example, the prefix map generator 107 analyzes a set of data representative of the data expected to be stored by the data storage system 102 to determine a statistical distribution of the number of bits in the remaining bits 203 of data fields after truncating leading zeros. Based on the statistical distribution, the prefix map generator 107 associates prefix codes with numbers of bits.

Figure 4:
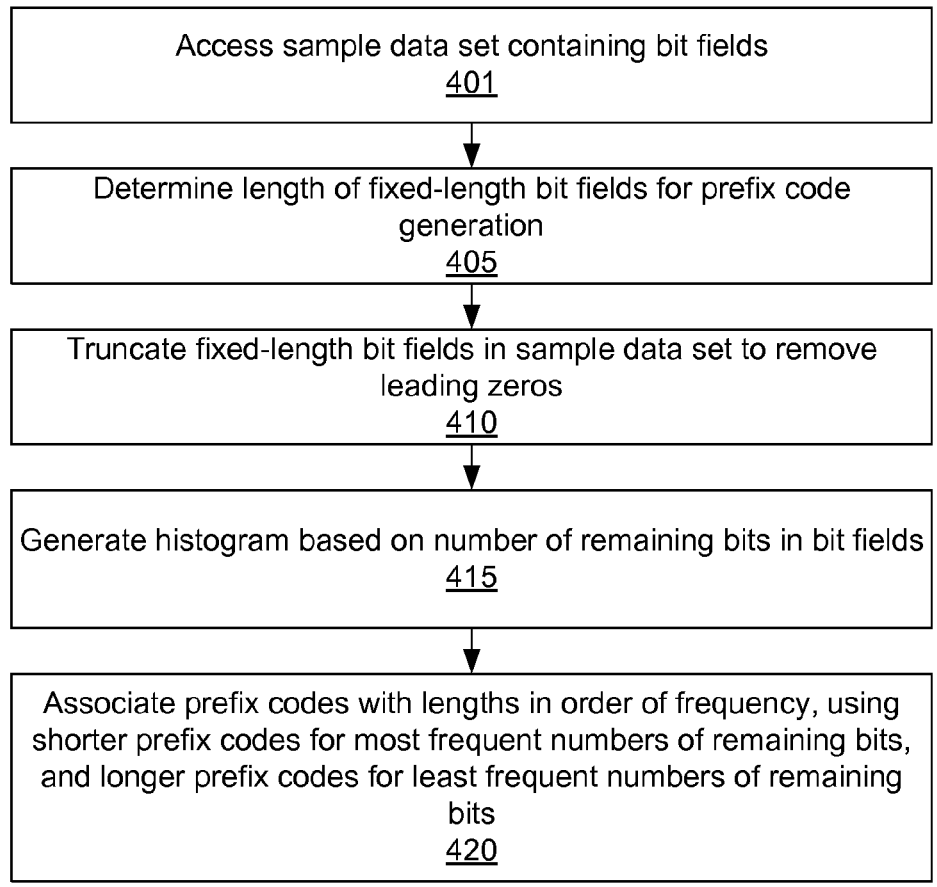
FIG. 4 illustrates a process for generating a prefix mapping index using statistical analysis of data, according to one embodiment.

FIG. 4 shows one embodiment of a process for associating prefix codes with numbers of bits based on statistical analysis of data. As shown in FIG. 4, the prefix map generator 107 accesses 401 a sample data set including fixed-length bit fields representative of information expected to be stored by the data storage system 102. In one embodiment, the sample data set is a representative set of data previously stored by the data storage system 102. In another embodiment, the sample data set is data previously stored by another data storage system or suitable system.

The length of the fixed-length bit field for prefix code generation is then determined 405. The prefix codes generated differ based on the length of the fixed-length bit fields. For example, the prefix generator 107 determines 405 whether the fixed-length bit fields are 32-bit, 64-bit, 128-bit, or another length. In one embodiment, 64-bit fixed-length bit fields are used. The length of the fixed-length bit fields may be determined 405 by administrators based on hardware characteristics of the data storage system 102. For example, if the data storage system 102 uses a 64-bit operating system, a 64-bit fixed-length bit field may be determined 405.

Various fixed-length bit fields are retrieved from the sample data set and processed. The retrieved fixed-length bit fields are truncated 410 to remove the leading zeros, and a histogram based on the lengths of the bits remaining in each retrieved bit field after truncation is generated 415. In one embodiment, the generated histogram includes an entry for each possible number of bits for the remaining bits; for example, a histogram generated for 64-bit fixed-length bit fields includes 65 entries corresponding to possible numbers of bits from 0 to 64. Each entry in the histogram indicates the frequency of bit fields (i.e., number of bit fields) including a particular number of bits after truncation 410 of leading zeros.

Based on the frequency of numbers of bits comprising the remaining bits from the histogram, prefix codes are associated 420 with various numbers of bits. In one embodiment, the length of a prefix code is based on the frequency with which an associated number of bits appears in the histogram. Hence, shorter prefix codes are associated with the most frequent numbers of bits and longer prefix codes are associated with more infrequent numbers of bits.

Figure 5:
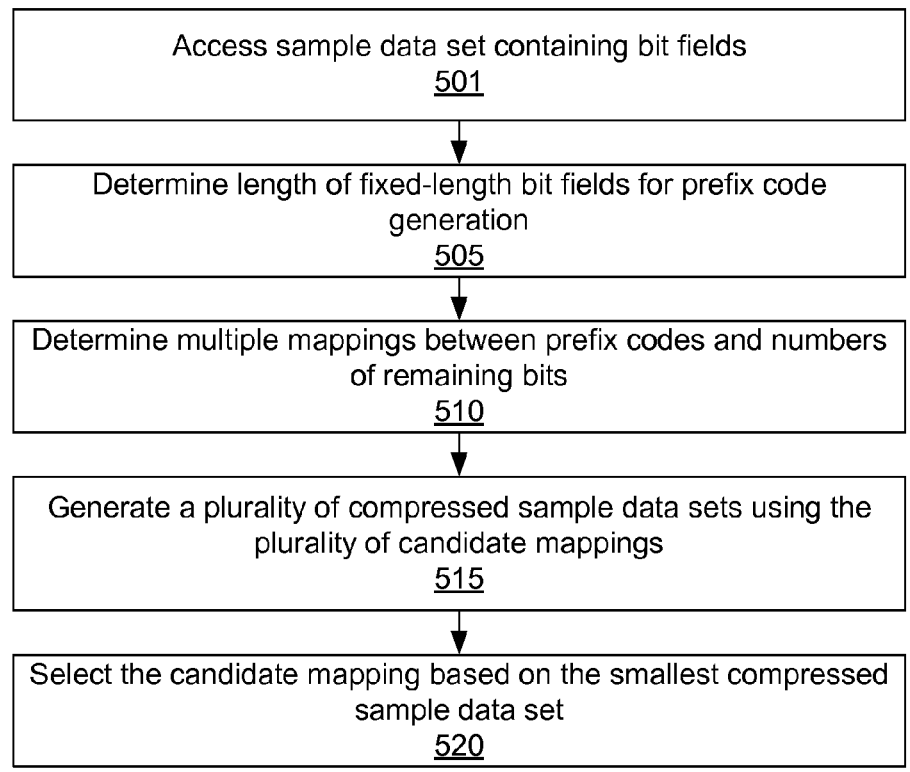
FIG. 5 illustrates a process for generating a prefix mapping index based on compression performance of different mappings, according to one embodiment.

Alternatively, the prefix map generator 107 associates prefix codes with numbers of remaining bits by analyzing multiple mappings between numbers of remaining bits and prefix codes, and selecting a mapping optimizing compression by the DDVL-E 103. FIG. 5 illustrates a process for generating a prefix mapping by testing the compression performance of various mappings between numbers of remaining bits and prefix codes. A sample data set including fixed-length bit fields is accessed 501 and a length of the fixed-length bit fields for prefix code generation is determined 505, as described above in conjunction with FIG. 4. Multiple mappings between prefix codes and numbers of remaining bits are determined 510, generating a plurality of candidate mappings. For example, all mappings between prefix codes and numbers of remaining bits are determined 510. Each candidate mapping fully maps multiple prefix codes to numbers of remaining bits.

Using the plurality of candidate mappings, a plurality of compressed sample data sets are generated 515. In one embodiment, if partial compression of the sample data set using a candidate mapping results in a larger data set than a previously generated compressed sample data set, the candidate mapping is disregarded and generation of the compressed sample data set from it is halted. In one embodiment, the prefix codes are selected 520 based on the candidate mapping resulting in the smallest compressed sample data set. However, other criteria may be used to select 520 the prefix codes.

Compression Process Details

The DDVL-E 103 receives data provided to the data storage system 102 from clients 100. Before the provided data is stored, it is compressed by the DDVL-E 103. In one embodiment, the DDVL-E 103 processes the data as multiple fixed-length bit fields. As described above in conjunction with FIG. 4, a length of the fixed-length bit fields is determined when prefix codes used for compression are generated.

Figure 6:
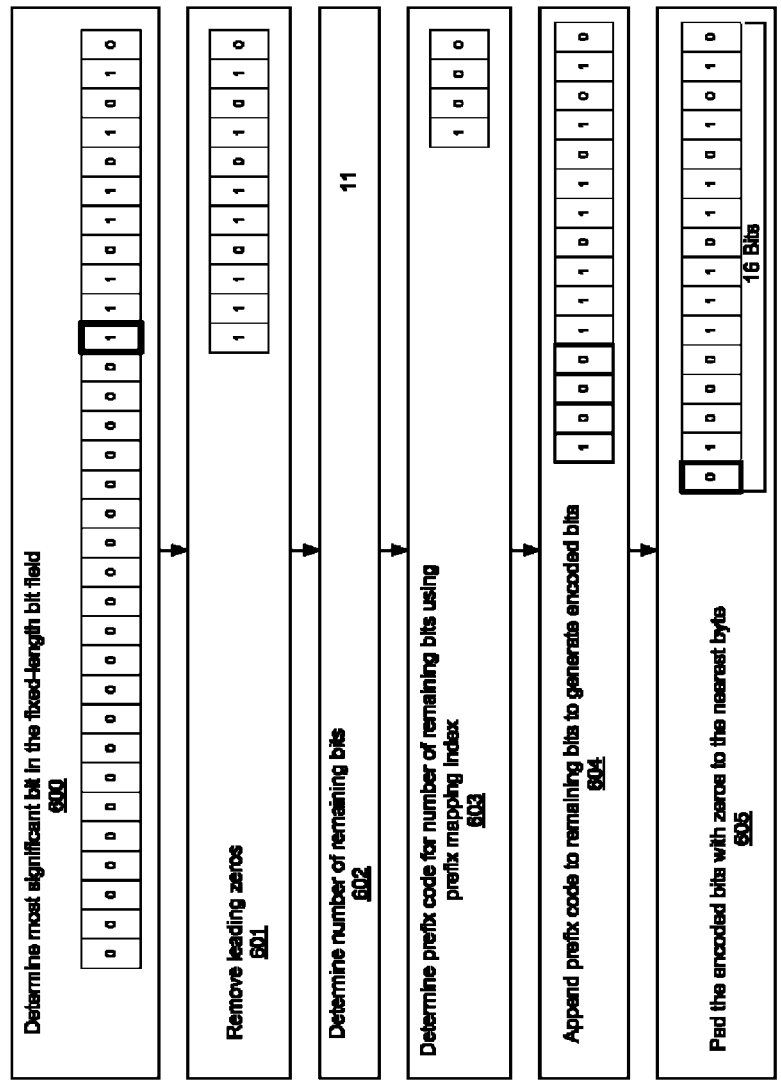
FIG. 6 illustrates a process for compressing data using a data-driven variable length encoder, according to one embodiment.

FIG. 6 illustrates one embodiment of a process for compressing fixed-length bit fields. For purposes of illustration, FIG. 6 shows compression of bit fields 32 bits in length, but other length bit fields may be compressed using the steps described in conjunction with FIG. 6. The most significant bit in the fixed-length bit field is determined 600. In one embodiment, the most significant bit is determined 600 by loading the bit field into a register and performing a left shift operation until the left-most bit in the register contains a non-zero value. A non-zero value in the left-most bit of the register may be identified by performing a bitwise AND operation with a register having only its left-most bit set to 1.

After determining 600 the most significant bit, the leading zeros 201 of the bit field are removed 601, and the number of remaining bits 203 in the bit field is determined. In the example shown by FIG. 6, 11 bits remain after removing 601 the leading zeros. Based on the number of remaining bits, a prefix code is determined 603 from the mapping between prefix codes and numbers of remaining bits from the prefix mapping index 106. In the example of FIG. 6, the prefix code associated with 11 remaining bits is "1000."

The prefix code is appended 604 to the remaining bits 203, generating a bit field having a length that varies based on the appended prefix code. The variable length bit field is smaller than the original fixed-length bit field. In the example shown by FIG. 6, the variable length bit field is 15 bits in length, while the original fixed-length bit field is 32 bits in length, resulting in a space saving of over 50%. In some embodiments, the variable length bit field is padded 505 with leading zeros to increase its length to the nearest multiple of 8. This allows the variable length bit field to be more efficiently stored in byte-sized storage. In the example of FIG. 6, a single zero is added prior to the leftmost bit of the 15-bit variable length bit field to create a bit field having a length of 16 bits that may be stored using two 8-bit bytes.

The above-described steps may be repeated for additional fixed-length bit fields from the received data to compress the received data. The compressed data is stored in the data store 105. The data storage system 102 identifies locations in the data store 105 where the compressed data is stored, and the size of the compressed data, to simplify later retrieval and decompression of the compressed data.

Decompression Process Details

When the data storage system 102 receives a request to access stored data, the DDVL-D 104 decompresses the compressed data stored in the data store 105, allowing the decompressed data to be communicated to a client 100 or other device requesting the data. To provide the stored data, the DDVL-D 104 reverses the compression performed by the DDVL-E 103 to reconstruct the original fixed-length bit fields. FIG. 7 describes one embodiment of a process for reconstructing a fixed-length bit field of the original data from compressed data stored by the data store 105. The steps described in conjunction with FIG. 7 may be performed on multiple variable length bit fields in the data store 105.

The compressed data is located from the data store 105 and the DDVL-D 104 determines 700 the first non-zero bit in the compressed data and discards 701 leading zeros before the first non-zero bit. Bits after the first non-zero bit in the variable length bit field are selected until a next non-zero bit is identified. The prefix code of the variable length bit field is determined 702 from the selected bits. Based on the prefix code and mappings between the prefix code and numbers of remaining bits in the prefix mapping index 106, the number of remaining bits is determined 703. In the example of FIG. 7, the prefix code is determined 702 to be "1000," so the number of remaining bits is determined 703 to be 11 from the prefix mapping index 106.

The prefix code is then discarded 704, and the number of bits identified from the prefix code are selected from the variable length bit field. These selected bits are the remaining bits of the original data without the leading zeros. The original fixed-length bit field is reconstructed by padding these bits with leading zeros to provide a bit field having the length of the original fixed-length bit field.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure. Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described. Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method comprising:
accessing a sample data set including a plurality of fixed-length sample bit fields;
determining numbers of remaining bits in each of the plurality of fixed-length sample bit fields, a number of remaining bits indicating a number of bits in a fixed-length sample bit field after removing leading zeros from the sample bit field;
generating a plurality of prefix code mappings, each prefix code mapping associating a prefix code with each number of remaining bits after removing leading zeros from the sample bit fields;
selecting a prefix code mapping;
receiving a fixed-length bit field;
determining a most significant bit of the fixed-length bit field;
removing zeros preceding the most significant bit from the fixed-length bit field;
determining a number of remaining bits in the fixed-length bit field after removing the zeros;
identifying a prefix code associated with the number of remaining bits in the fixed-length bit field based on the selected prefix code mapping;
appending the prefix code to the remaining bits in the fixed-length bit field;
appending leading zeros before the prefix code to generate a bit field having a length that is an integer multiple of a byte of data; and
storing the generated bit field having the length that is the integer multiple of the byte of data.

2. The method of claim 1, wherein selecting the prefix code mapping comprises:
encoding the sample data set using each of a plurality of prefix code mappings;
determining a size of an encoded sample data set associated with each of the plurality of prefix code mappings; and
selecting a prefix code mapping associated with an encoded data set having a smallest size.

3. The method of claim 1, wherein the fixed-length bit field is 64 bits in length.

4. The method of claim 1, wherein the prefix code is a sequence of bits having a single non-zero bit.

5. A method comprising:
determining a size of a fixed-length bit field;
retrieving a bit field comprising a plurality of bits;
identifying a first non-zero bit within the bit field;
removing zeros preceding the first non zero bit from the bit field;
selecting the first-non zero bit and bits between the first non zero bit and a next non zero-bit;
retrieving a prefix code based on the selected bits;
determining a number of bits associated with the prefix code;
selecting the number of bits associated with the prefix code from the bit field; and
appending zeros before the selected number of bits associated with the prefix code from the bit field to generate a bit field having the size of the fixed-length bit field.

6. A method comprising:
accessing a sample data set including a plurality of fixed-length sample bit fields;

determining a frequency of numbers of remaining bits in each of the plurality of fixed-length sample bit fields, a number of remaining bits indicating a number of bits in a fixed-length sample bit field after removing leading zeros from the sample bit field;

associating a prefix code with each number of remaining bits based on the frequency with which a number of remaining bits occurs in the plurality of fixed-length sample bit fields after removing leading zeros from the sample bit fields;

receiving a fixed-length bit field;

determining a most significant bit of the fixed-length bit field;

removing zeros preceding the most significant bit from the fixed-length bit field;

determining a number of remaining bits in the fixed-length bit field after removing the zeros;

identifying a prefix code associated with the number of remaining bits in the fixed-length bit field;

appending the prefix code to the remaining bits in the fixed-length bit field;

appending leading zeros before the prefix code to generate a bit field having a length that is an integer multiple of a byte of data; and storing the generated bit field having the length that is the integer multiple of the byte of data.

7. The method of claim 6, wherein associating the prefix code with each of the numbers of remaining bits based on the frequency with which the number of remaining bits occurs in the sample data set comprises:

generating a histogram based on the numbers of remaining bits in each of the plurality of fixed-length sample bit fields after removing leading zeros from the fixed-length sample bit fields; and associating prefix codes with each number of remaining bits so the length of a prefix code associated with a number of remaining bits is inversely proportional to a frequency with which the number of remaining bits appears in the histogram.

8. The method of claim 7, wherein associating prefix codes with each number of remaining bits so the length of the prefix code associated with the number of remaining bits is inversely proportional to a frequency with which the number of remaining bits appears in the histogram comprises:

associating a prefix code having a shortest length with a number of remaining bits appearing most frequently in the histogram.

9. The method of claim 7, wherein associating prefix codes with each number of remaining bits so the length of the prefix code associated with the number of remaining bits is inversely proportional to a frequency with which the number of remaining bits appears in the histogram comprises:

associating a prefix code having a longest length with a number of remaining bits appearing least frequently in the histogram.

10. The method of claim 6, wherein the fixed-length bit field is 64 bits in length.

11. The method of claim 6, wherein the prefix code is a sequence of bits having a single non-zero bit.

\* \* \* \* \*